(12) United States Patent
Cavanaugh et al.

(10) Patent No.: US 7,022,916 B1
(45) Date of Patent: Apr. 4, 2006

(54) TECHNIQUES FOR CONTROLLING MOVEMENT OF A SET OF CABLES

(75) Inventors: Barry Cavanaugh, Douglas, MA (US); Gary Goulet, Pascoag, RI (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/442,805

(22) Filed: May 21, 2003

(51) Int. Cl.
*G05K 7/02* (2006.01)

(52) U.S. Cl. .................... 174/72 A; 174/135; 174/100; 361/683; 361/625; 361/826

(58) Field of Classification Search .............. 174/72 A, 174/135, 100; 361/683, 825, 826
See application file for complete search history.

(56) References Cited

U.S. PATENT DOCUMENTS

| | | | |
|---|---|---|---|
| 5,039,828 A * | 8/1991 | Marks et al. ................ | 174/135 |
| 5,921,402 A * | 7/1999 | Magenheimer ............... | 211/26 |
| 6,392,149 B1 * | 5/2002 | Kim et al. .................. | 174/72 A |
| 6,621,692 B1 | 9/2003 | Johnson et al. ............. | 361/683 |
| 6,791,841 B1 | 9/2004 | Tirrell et al. ................ | 361/724 |

* cited by examiner

Primary Examiner—Jinhee Lee
(74) Attorney, Agent, or Firm—BainwoodHuang; David E. Huang, Esq.

(57) ABSTRACT

An electronic cabinet has an electronic cabinet frame, and a chassis which slidably mounts to the electronic cabinet frame. The chassis is configured to house electronic equipment. The electronic cabinet further has a cable guide which is configured to guide movement of a set of cables which connects to the electronic equipment. The cable guide includes an arm member that defines a set of support portions and a set of hinges. The set of support portions and the set of hinges are integrated together to form a contiguous, unitary body which is configured to support the set of cables. The cable guide further includes a first attachment subsystem to attach the arm member to the electronic cabinet frame, and a second attachment subsystem to attach the arm member to the chassis.

12 Claims, 6 Drawing Sheets

TECHNIQUES FOR CONTROLLING MOVEMENT OF A SET OF CABLES

BACKGROUND OF THE INVENTION

A typical electronic cabinet includes a frame, chassis (e.g., housings, card cages, etc.) that mount to the frame to support electronic equipment (e.g., general purpose computer equipment, equipment for a data storage system, network equipment, etc.), and panels (e.g., side panels, doors, front panels, etc.) that attach to the frame to protect the electronic equipment. Some electronic cabinets are available in standard sizes such as a 19-inch equipment rack which enables attachment of standard-sized 19-inch chassis in a vertically-tiered manner within an interior cavity defined by the frame.

One conventional electronic cabinet includes a chassis that mounts onto a set of sliding rails (e.g., guide rollers) fastened to the cabinet frame to enable the chassis to slide out the front of the cabinet from the interior cavity, and back into the interior cavity. Such a cabinet provides convenient access to the electronic equipment housed within the chassis. For example, a technician performing a maintenance or upgrade procedure can easily pull the chassis out of the interior cavity in order to probe or replace particular circuitry supported by the chassis, and subsequently push the chassis back into the interior cavity when the procedure is complete.

For the above-described conventional electronic cabinet, cables (e.g., wires carrying data signals and power supply signals, fiber optic cables carrying fiber optic signals, etc.) typically reside at the back of the cabinet. In particular, the cables typically extend toward the back of the chassis from other areas of the electronic cabinet (e.g., from power supplies or power buses, from other chassis, from external locations, etc.).

To prevent tangling and uncontrolled movement of the cables, the above-described electronic cabinet includes a metallic cable carrier which restricts movement of the cables when the technician slides the chassis into and out of the cabinet frame. The metallic cable carrier includes a series of metallic beams and metallic hinges that extends from a location on the cabinet frame to a location on the slidable chassis. The metallic cable carrier further includes individual clips which attach to the metallic beams and which hold the cables onto the metallic beams. When adding a new cable to the metallic cable carrier, the technician opens each clip, inserts a portion of the new cable into that clip, and closes that clip to secure that portion of the new cable to the carrier.

When the technician slides the chassis out of the cabinet frame, the metallic cable carrier elongates and thus moves the cables from contracted positions to straightened-out positions in a smooth and orderly manner that allows the cables to remain connected the electronic equipment within the chassis. In particular, the metallic beams pivot about the metallic hinges within a common vertical plane to provide controlled and organized movement of the cables thus minimizing the chance of unnecessarily stressing the cables in a manner that would result in cable disconnection or perhaps result in damage to the cables. When the technician slides the chassis back into the interior cavity, the metallic cable carrier folds up thus returning the cables back to their original contracted positions.

SUMMARY OF THE INVENTION

Unfortunately, there are deficiencies to the above-described conventional electronic cabinet which uses a metallic cable carrier having metallic beams and metallic hinges. For example, each metallic beam and metallic hinge is a separate component that requires assembly relative to the other separate components in order to form the conventional metallic cable carrier. As a result, the cost to manufacture each individual component and to subsequently assemble the components to form the conventional metallic cable carrier makes the conventional metallic cable carrier somewhat expensive and difficult to manufacture.

Additionally, during installation of the cables onto the conventional metallic cable carrier, the technician must tediously and meticulously open and close individual clips in order to secure the cables to the carrier. Such a process is time consuming and thus increases the cost of assembling the final electronic system.

Furthermore, since the conventional metallic cable carrier is composed of many parts (e.g., separate metallic beams, hinges, clips etc.), the carrier is susceptible to many potential points of failure. For example, it is possible for a clip or a hinge to inadvertently detach from a metal beam due to improper assembly or due to an accidental force applied to the carrier at the back of the electronic cabinet. Such detachment can result in improper operation of the carrier when the chassis slides out of or back into place. Moreover, complete detachment of a carrier component (e.g., the axle of a hinge) could cause damage to another part of the electronic system (e.g., a metallic part detaching from the carrier could short other electronic circuitry).

In contrast to the above-described conventional electronic cabinet which uses a metallic cable carrier having individual metallic beams and hinges, embodiments of the invention are directed to techniques for guiding movement of a set of cables (i.e., one or more cables) in an electronic cabinet using a flexible arm member having a set of support portions and a set of hinges which are integrated together to form a contiguous, unitary body (e.g., a solid piece of homogenous plastic material). Utilization of such an arm member provides controlled movement of the set of cables but enables a reduction in manufacturing costs (e.g., less parts and less time needed for assembly) and an improvement in reliability (e.g., less possible points of failure).

One embodiment of the invention is directed to an electronic cabinet having an electronic cabinet frame, and a chassis which slidably mounts to the electronic cabinet frame. The chassis is configured to house electronic equipment (e.g., circuit boards for a general purpose computer or a data storage system, etc.). The electronic cabinet further includes a cable guide which is configured to guide movement of a set of cables which connects to the electronic equipment. The cable guide includes an arm member that defines a set of support portions and a set of hinges. The set of support portions and the set of hinges are integrated together to form a contiguous, unitary body which is configured to support the set of cables. The cable guide further includes a first attachment subsystem to attach the arm member to the electronic cabinet frame, and a second attachment subsystem to attach the arm member to the chassis. Such a cable guide is relatively simple and inexpensive to manufacture, but nevertheless provides robust and reliable control over movement of the set of cables.

In one arrangement, the arm member of the cable guide further includes a set of cable retainers which is integrated with the set of support portions and the set of hinges to form the contiguous, unitary body which is configured to guide movement of the set of cables. In this arrangement, each retainer is essentially an extension of the contiguous, unitary body (e.g., a clip, a hook, a U-shaped or L-shaped portion, etc.) which, in combination with an associated support portion, defines a bough or trough into which the set of cables can reside. Accordingly, this arrangement uses fewer separate components than a conventional metallic cable carrier having individual metallic beams, metallic hinges and clips.

In one arrangement, the contiguous, unitary body includes homogenous plastic material (e.g., polypropylene) which provides resiliency and flexibility at the set of hinges to enable the support portions to pivot relative to each other within a common plane. In this arrangement, certain support portions preferably have I-beam-shaped cross-sections to provide stiffness to those portions. Accordingly, the arm member is capable of being manufactured in a reliable and inexpensive process such as supplying molten plastic polymer into a mold that defines the particular features of the arm member (e.g., an injection molding process).

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for guiding movement of a set of cables (i.e., one or more cables) in an electronic system using an arm member having a set of support portions and a set of hinges which are integrated together to form a contiguous, unitary body (e.g., a solid piece of homogenous plastic material). Utilization of such an arm member within the electronic system provides controlled movement of the set of cables but enables a reduction in manufacturing costs (e.g., less parts and time required for assembly) and an improvement in reliability (e.g., less potential points of failure).

Figure 1:
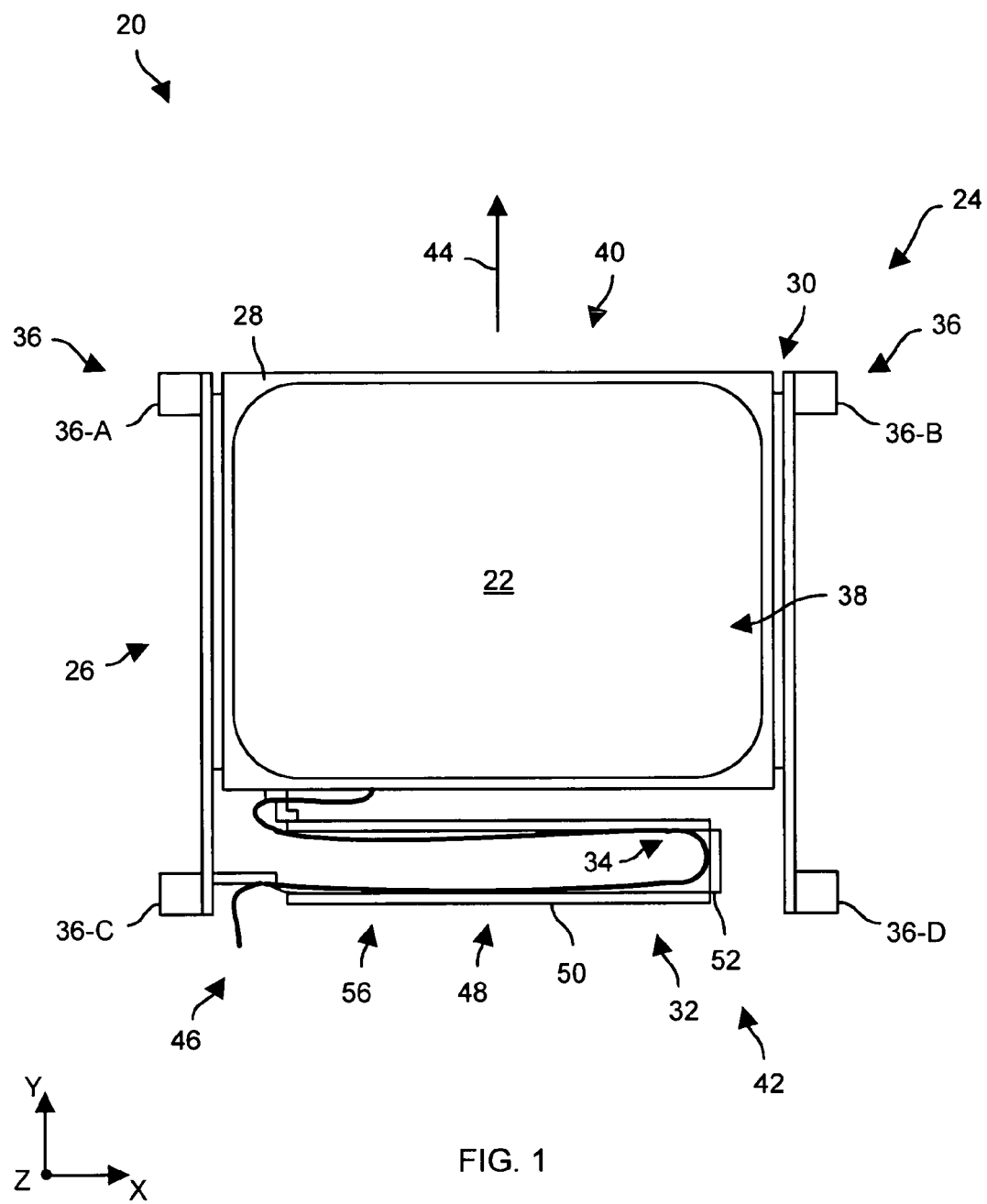
FIG. 1 is a top cross-sectional view of an electronic system which is suitable for use by the invention when a cable guide of the electronic system is in a compressed position.
Figure 2:
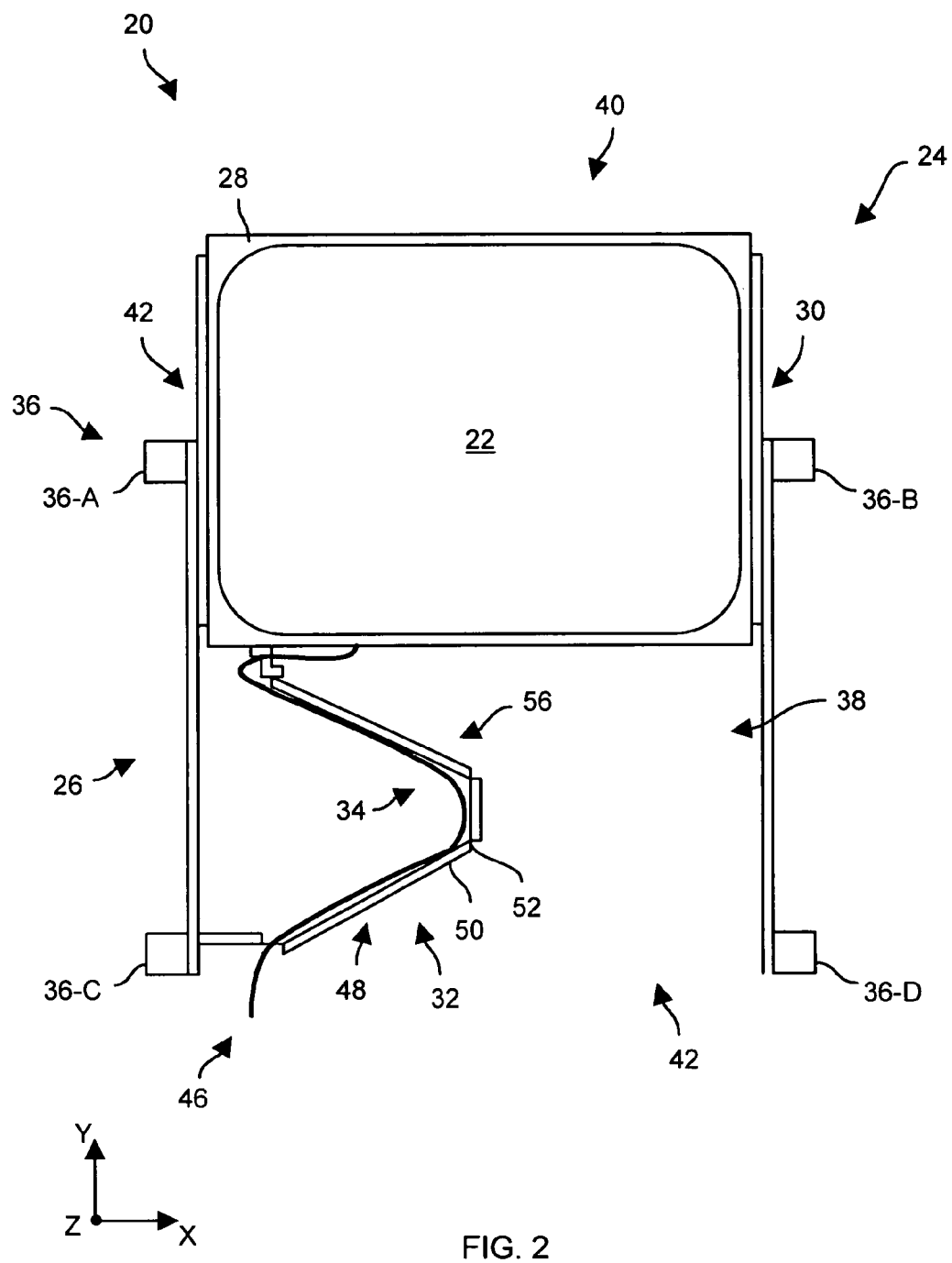
FIG. 2 is a top cross-sectional view of the electronic system of FIG. 1 when the cable guide is in an extended position.

FIGS. 1 and 2 show cross-sectional top views of an electronic system 20 which is suitable for use by the invention. The electronic system 20 includes, among other things, electronic equipment 22 (e.g., circuitry for a data storage system, a general purpose computer, network equipment, individual electronic devices, specialized electronics, combinations thereof, etc.) and an electronic cabinet 24 which supports the electronic equipment 22. The electronic cabinet 24 includes an electronic cabinet frame 26, a chassis 28 (e.g., a housing, a carrier, a card cage, etc.), a slidable chassis mount 30 (e.g., low friction sliding rails, ball-bearing rollers, etc.), a cable guide 32, and a set of cables 34 (one or more cables 34 even though only one cable 34 is shown for simplicity). In one arrangement, the electronic cabinet 24 is a standard-sized 19-inch rack mount assembly which supports a variety of equipment in a vertically-tiered manner.

The frame 26 of the electronic cabinet 24 includes rigid members 36 (e.g., vertical and horizontal steel trusses) which define an interior space 38, and support the various parts of the electronic system 20. For example, the frame 26 includes vertical rigid members 36-A, 36-B, 36-C, and 36-D which substantially define the height of the cabinet 24 in the Z-direction in FIGS. 1 and 2. In particular, the vertical rigid members 36-A, 36-B define a front 40 of the cabinet 24. Similarly, the vertical rigid members 36-C, 36-D define a back 42 of the cabinet 24. It should be understood that the vertical rigid members 36-A, 36-B, 36-C, and 36-D are shown cross-sectionally since FIGS. 1 and 2 are cross-sectional top views of the electronic system 20. It should be further understood that the rigid members 36 of the frame 26 are capable of supporting other items including external panels (e.g., doors, sides, covers, etc.), power supplies, backplanes, etc., which are not shown in FIGS. 1 and 2 for simplicity.

The chassis 28 supports the electronic equipment 22. The slidable chassis mount 30 interconnects the chassis 28 with the frame 26 and enables the chassis 28 to move relative to the frame 26. For example, FIG. 1 shows the chassis 28 residing within the interior space 38 defined by the frame 26. In contrast, FIG. 2 shows the chassis 28 substantially extending from the interior space 38 after a user has pulled the chassis 28 out the front 40 of the cabinet 24 in a direction 44 (see the arrow 44 extending in the Y-direction in FIG. 1). When the chassis 28 is in the extended position as shown in FIG. 2, the user has improved access to the electronic equipment 22 within the chassis 28 and thus is capable of more-easily performing particular servicing procedures on the electronic equipment 22 (e.g., testing or probing particular circuitry, replacing or upgrading a circuit board, etc.). When the user is through accessing the electronic equipment 22, the user returns the chassis 28 to its original position by pushing the chassis 28 toward the frame 26 in a direction opposite the arrow 44 (see FIG. 1).

It should be understood that the cable guide 32 attaches to both the chassis 28 and the frame 26, and robustly and reliably supports the set of cables 34 within the electronic cabinet 24. In particular, the set of cables 34 provides connectivity between the electronic equipment 22 (e.g., electrical data and power signals, fiber optic signals, etc.) and other locations 46 (e.g., internal locations within the electronic cabinet 24, external locations outside the electronic cabinet 24), and the cable guide 32 holds the set of cables 34 in an organized and stable manner to prevent the set of cables 34 from failing (e.g., to prevent the cables 34 from becoming tangled and/or disconnected from the electronic equipment 22, to prevent the cables 34 from sustaining damage when a user accesses the back 42 of the cabinet 24, etc.).

For example, FIG. 1 shows the cable guide 32 in a compressed, U-shaped position. Here, the set of cables 34 preferably run along the inner side of the cable guide 32. Since the cable guide 32 runs along the periphery of the set of cables 34, the cable guide 32 shields the set of cables 32 against inadvertent forces, e.g., against accidental damage from movement of a user's hand or a sharp tool.

Additionally, when the user moves the chassis 28 in the direction of the arrow 44 (see FIG. 1), the cable guide 32 guides movement of the set of cables 32. In particular, as shown in FIG. 2, the cable guide 32 elongates from the compressed, U-shaped position to an extended position. As the cable guide 32 elongates, the cable guide 32 guides the set of cables 34 so that the set of cables 34 transitions to a more-straightened-out position as shown in FIG. 2. During such a transition, the cable guide 32 maintains the set of cables 34 in a steady and secure manner to prevent the set of cables 34 from tangling or overstressing in a manner that could otherwise result in a connectivity failure. That is, the smooth and deliberate movement of the cable guide 32 and, thus, the set of cables 34, minimizes the likelihood of the set of cables 34 becoming disconnected or fracturing as the chassis 28 slides out from the frame 26. Similarly, when the user later moves the chassis 28 in the direction opposite the arrow 44, the cable guide 32 transitions the set of cables 34 back to its original compressed position. In particular, the cable guide 32 folds the set of cables 34 in a smooth and orderly manner. As a result, the set of cables 34 return to its original position in which it is shielded against external forces by the cable guide 32 (see FIG. 1).

It should be understood that the cable guide 32 includes an arm member 48 that defines a set of support portions 50 and a set of hinges 52 which are integrated together to form a contiguous, unitary body 54 which is configured to control the movement of the set of cables 34. The use of such an arm member 48 alleviates the need for many individual components thus reducing manufacturing costs and minimizing points of failure. That is, in contrast to conventional metallic cable carriers consisting of separate metallic components (e.g., metallic beams, metallic hinges, clips, etc.), the cable guide 32 has less individual parts. Accordingly, the cable guide 32 is simpler and takes less time to assemble. Furthermore, since there are fewer pieces, there are fewer potential points of failure (e.g., vis-à-vis the conventional metallic cable carrier in which hinge hardware or the hinges themselves could fail and break off). Further details of the cable guide 32 will now be provided with reference to FIGS. 3 through 5.

Figure 3:
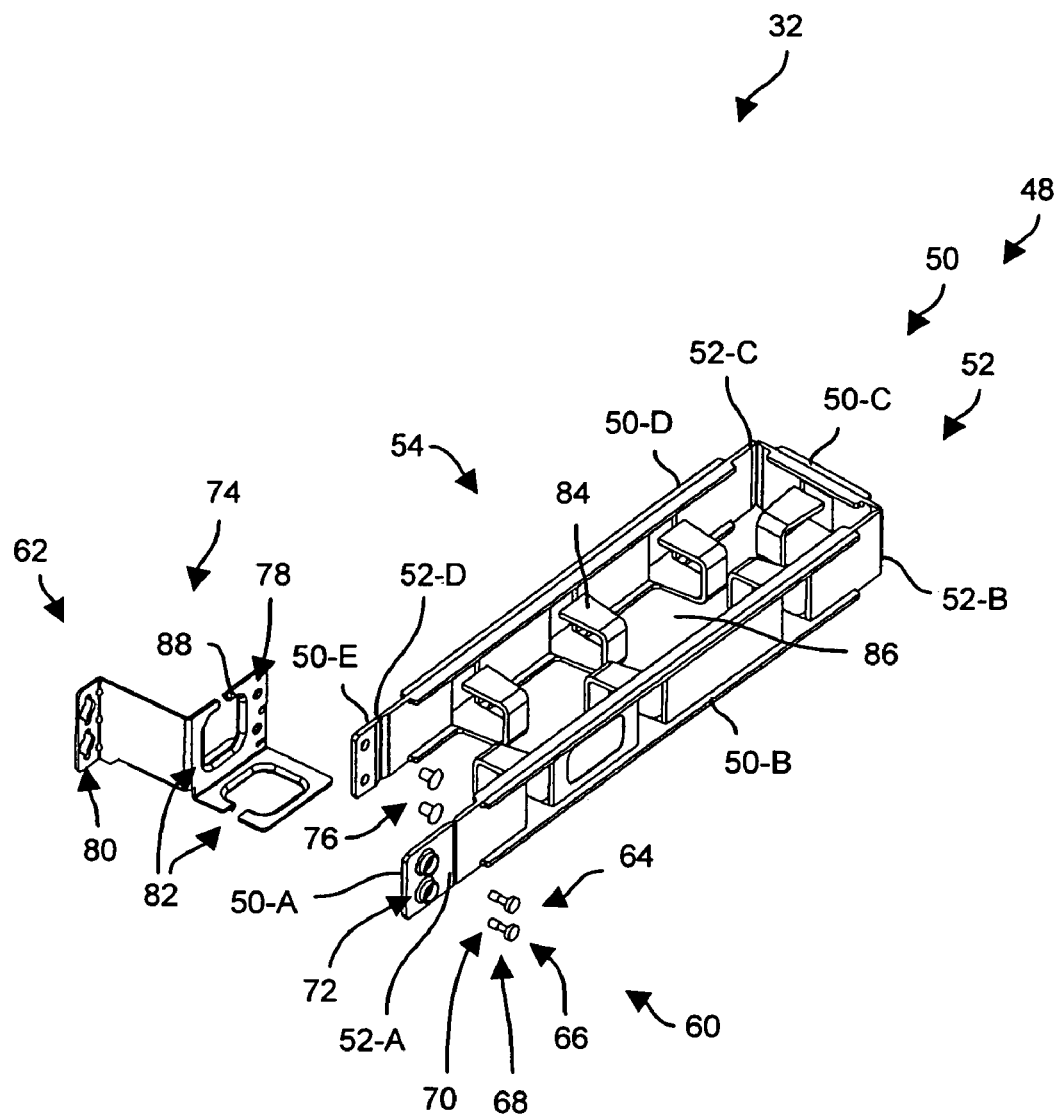
FIG. 3 is an exploded view of the cable guide of FIGS. 1 and 2.

FIG. 3 is an exploded view of the cable guide 32. In addition to the arm member 48, the cable guide 32 includes a first attachment subsystem 60 to attach the arm member 48 to the electronic cabinet frame 26, and a second attachment subsystem 62 to attach the arm member 48 to the chassis 28. Further details of the first and second attachment subsystems 60, 62 will be provided shortly. As shown in FIG. 3, the arm member 48 includes support portions 50-A, 50-B, 50-C, 50-D, 50-E (collectively, support portions 50), and hinges 52-A, 52-B, 52-C, 52-D (collectively, hinges 52) which are interleaved together to form a solid, unitary body or member 54. The material of the arm member 48 is narrower at the hinges 52 to enable the support portions 50 to pivot relative to each other substantially in a common plane (also see the X-Y plane in FIGS. 1 and 2). In one arrangement, the body 54 includes homogenous plastic material (e.g., injection molded polypropylene) to provide suitable durability and flexibility. In one arrangement, each support portion 50 has an I-beam cross-section for enhanced strength.

The first attachment subsystem 60 includes a set of screws 64 (e.g., two screws). Each screw 64 has a relatively wide head 66 at one end (e.g., a Phillips head), a narrower threadless shaft portion 68, and a wider threaded portion 70 at the other end. Each screw 64 is capable of threading through a corresponding narrow diameter hole 72 defined in the end support portion 50-A. The head 66 and threaded portion 70 are wider than the hole 72 thus enabling that screw 64 to "self-retain" onto the arm member 48 without any need for additional hardware. That is, the head 66s and the threads of the threaded portions 70 are wider than the holes 72 thus retaining the screws 60 on the support portion 50-A. The screws 60 are configured to securely thread into a portion of the cabinet frame 26 (also see FIGS. 1 and 2) in order to attach the cable guide 32 to the frame 26. Since the screws 60 are continuously retained on the support portion 50-A of the arm member 48, there is no loose hardware involved in attaching the cable guide 32 to the frame 26.

The second attachment subsystem 62 includes a bracket 74 and a set of fasteners 76 (e.g., a set of rivets) that securely fastens the bracket 74 to the end support portion 50-E through a set of fastener holes 78 defined in the bracket 74 and a corresponding set of holes defined in the end support portion 50-E. The bracket 74 further defines a set of chassis attachment holes 80 through which a set of mounting screws or posts of the chassis 28 can extend in order to secure the bracket 74 to the chassis 28. In one arrangement, the chassis 28 is pre-configured with the set of mounting screws or posts, and the chassis attachment holes 78 are generally keyhole-shaped so that there is no loose hardware. For this arrangement, the user hangs the bracket 74 onto heads of the screws or posts by inserting the heads through the chassis attachment holes 80. The user then tightens the screws or posts to secure the bracket 74 to the chassis 28. Accordingly, there is no loose hardware involved in attaching the cable guide 32 to the chassis 28.

In one arrangement, the electronic system 20 utilizes multiple cable guides 32 (e.g., a first cable guide 32 that mounts adjacent the vertical rigid member 36-C, and a second cable guide that mount adjacent the vertical rigid member 36-D, also see FIG. 1) in order to guide movement of more cables 34. For this arrangement, the same bracket design is preferably used for each cable guide 32, i.e., the holes 78 are preferably keyhole-shaped in both directions (i.e., there is a small notch at the top and at the bottom of each chassis attachment hole 80) to enable use of the same bracket design for both the multiple cable guides 32.

In one arrangement, the bracket 74 defines multiple cable slots or apertures 82 to provide the opportunity for cables 34 to pass in different directions toward the chassis 28. This arrangement is well-suited for situations in which connectors are distributed along the back side of the chassis 28. That is, when a user installs each cable 34, the user is capable of feeding that cable 34 through either slot 82 depending on the location of its corresponding connector on the back of the chassis 28. For some cables 34, a particular one of the slots 82 is better suited for retaining and guiding passage of those cables 34 toward the chassis 28 for smooth and orderly operation of the cable guide 32.

In one arrangement, the bracket 74 is formed from sheet metal stock having a first thickness (e.g., an eight of an inch), and the bracket 74 defines, at each cable slot 82, a grommet 88 having a second thickness that is greater than the first thickness. A suitable process for manufacturing the grommets 88 is to bend over portions of the sheet metal. The resulting grommets 88 provide a wider and less-sharp bend radius than the original metal stock in order to minimize the possibility of snagging or cutting the cables 34 passing through the slots 82.

As further shown in FIG. 3, the arm member 48 further includes a set of cable retainers 84. Each cable retainer 84 extends toward the inside region 86 defined by the arm member 48 when the arm member 48 is in the compressed position (also see FIG. 1). Accordingly, the cable retainers 84 hold the cables 34 on the inner side of the arm member 48 thus enabling the arm member 48 to protect the cables 34 against external forces which could otherwise damage the cables 34, e.g., damage from inadvertent movement of a user's hand or tool. By way of example only, the cable retainers 48 are U-shaped with a slot opening at the top to enable the user to slip the cables 34 therein. Accordingly, once the cables 34 are installed within the cable retainers 84, gravity prevents the cables 34 from inadvertently falling out of the cable guide 32. Moreover, the user does not need to open and close any clips as is required by the earlier-described conventional metallic cable carrier which uses individual separate clips to hold cables in place.

In one arrangement, the cable retainers 84 are evenly distributed along the support members 50 every few inches (e.g., 2 to 5 inches apart). By way of example only, the support member 50-B supports three cable retainers 84, the support member 50-D supports three cable retainers 84, and the support member 50-C which interconnects the support members 50-B and 50-D supports one cable retainer 84.

In one arrangement, the cable retainers 84 are integrated with the set of support portions 50 and the set of hinges 52 to form the contiguous, unitary body 54 of the arm member 48 (i.e., a single, solid piece of polypropylene). In this arrangement, in contrast to conventional metal carriers which include an assembly of individual metal beams and hinges fastened together using separate hardware), the arm member 48 is manufactured as one piece and thus does not require further time or effort to assembly. This enables manufacture of the cable guide 32 to be less expensive. Furthermore, the cable guide 32 has fewer separate parts vis-à-vis the conventional metal cable carrier so that when the cable guide 32 is in operation, there is less likelihood of a part becoming detached and failing into other equipment. In particular, since the arm member 48 is preferably made of non-conductive plastic material, there is no possibility that the arm member 48 can form a short between electrical connections.

Figure 4:
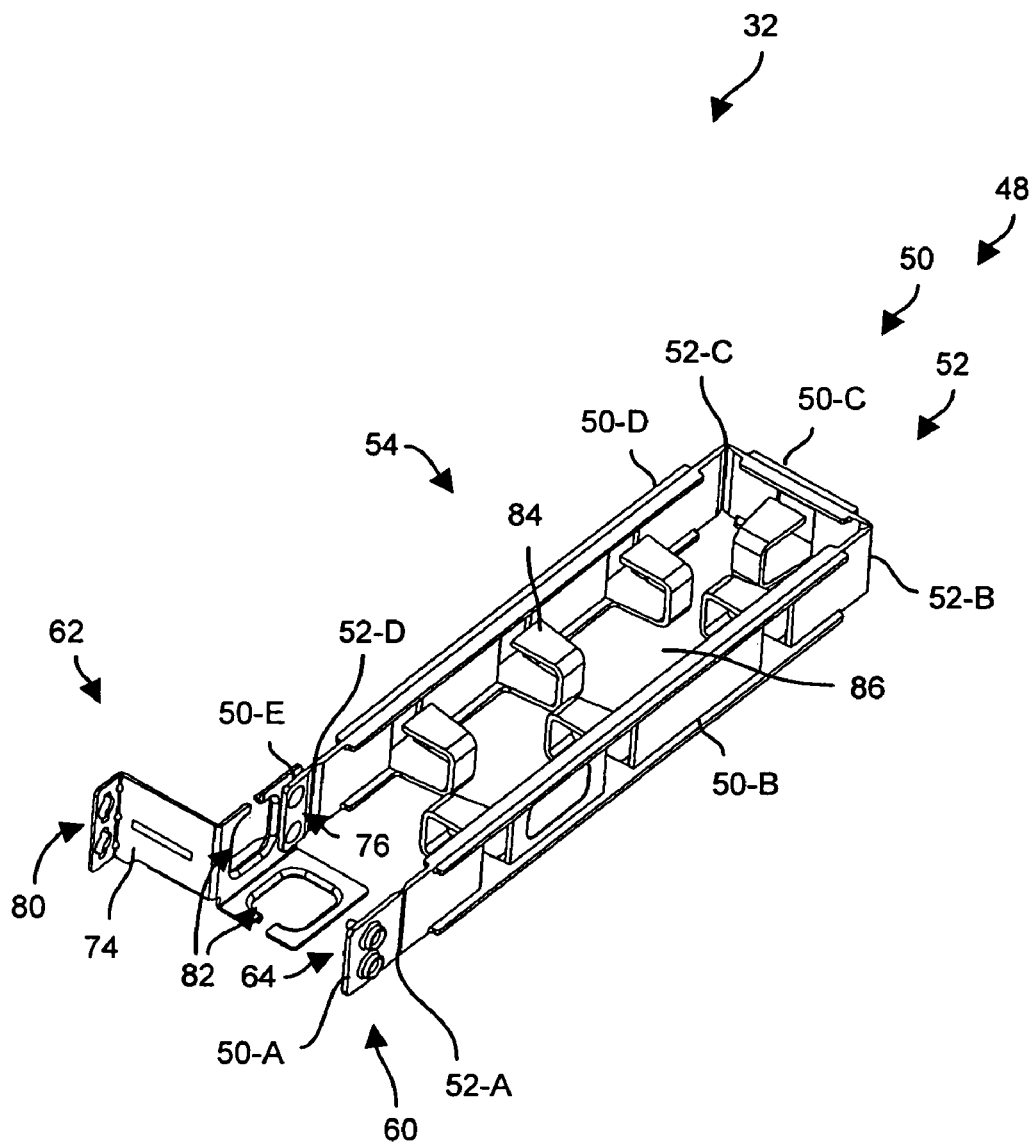
FIG. 4 is a detailed perspective view of the cable guide when in the compressed position.

FIG. 4 shows the cable guide 32 in the compressed position. This is the position of the cable guide 32 when the chassis 28 is fully disposed within the interior space 38 defined by the cabinet frame 26 (also see FIG. 1).

When the cable guide 32 is properly installed within the electronic cabinet frame 26, the bracket 74 fastens to the chassis 28 and the screws 64 retained by the arm member 48 fasten to the frame 26 (also see FIG. 1). Accordingly, the cable guide 32 opens and closes in response to movement of the chassis 28 relative to the frame 26. As mentioned earlier, since the cable retainers 84 extend toward the inner region 86 defined by the arm member 84, the arm member 84 protects the set of cables 34 which reside within the cable retainers 84 against external forces.

Figure 5:
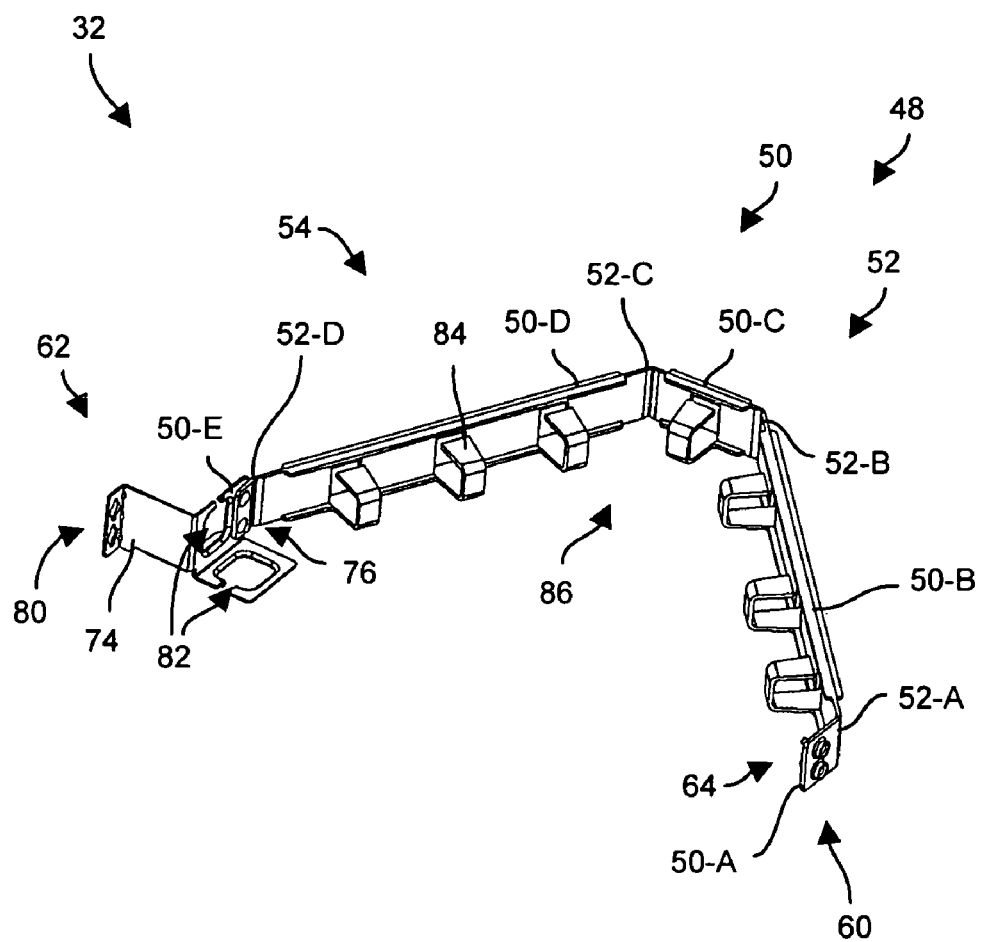
FIG. 5 is a detailed perspective view of the cable guide when in the extended position.

FIG. 5 shows the cable guide in a more-extended position. This is the position of the cable guide 32 when the chassis 28 extends out from the front 40 of the cabinet frame 26 (also see FIG. 2).

It should be understood that, as the chassis 28 moves from one position to another relative to the frame 26, the cable guide 32 robustly and reliably holds the set of cables 34 in a well-organized and safe manner. Accordingly, there is little or no likelihood of a cable 34 improperly stressing or failing. In particular, it is unlikely that any cable 34 will disconnect from a connector or plug, or that any cable 34 will abnormally bend or fracture. Further details of the cable guide 32 will now be provided with reference to FIG. 6.

Figure 6:
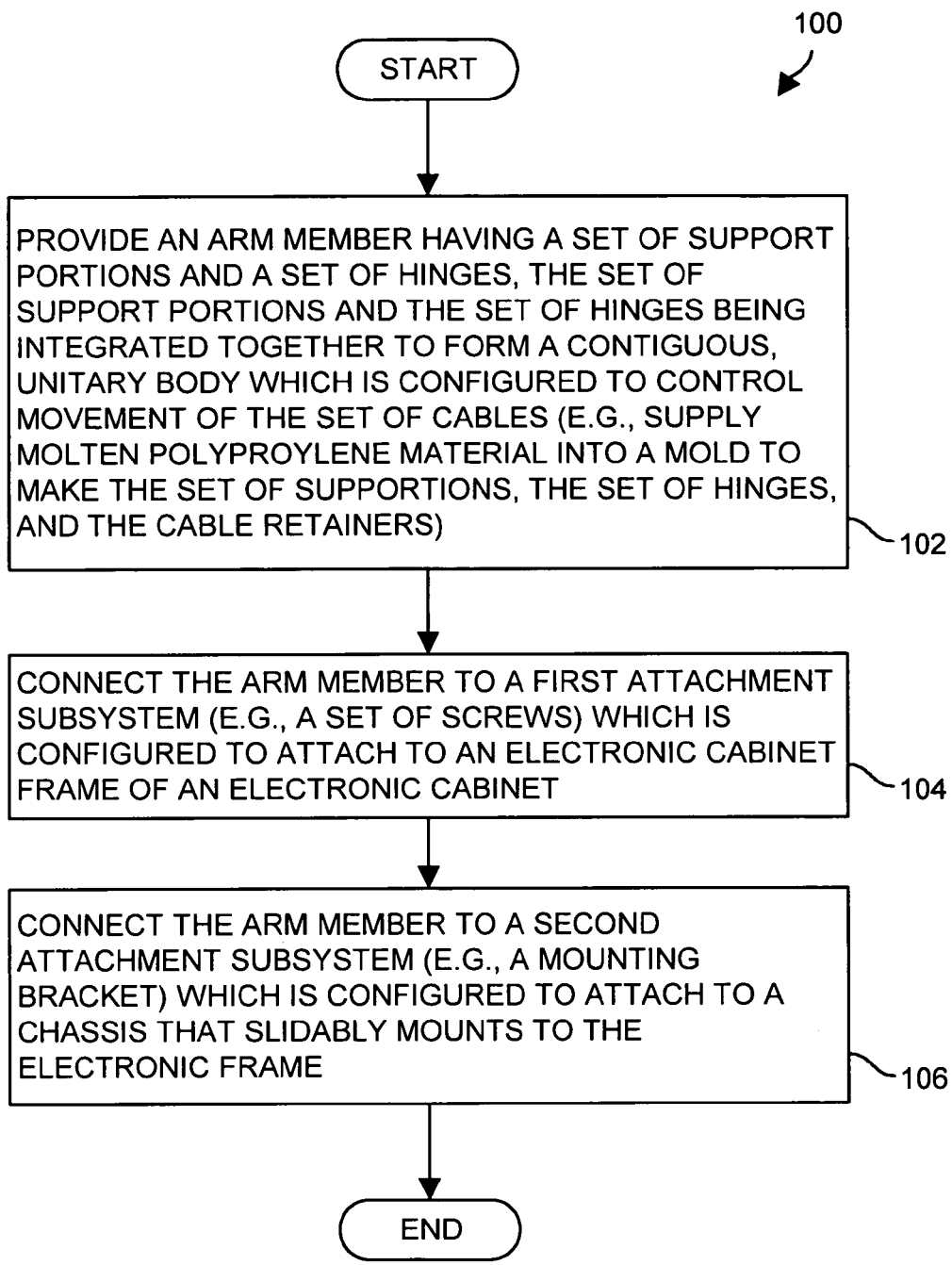
FIG. 6 is a flowchart of a procedure for manufacturing the cable guide of FIGS. 1 through 5.

FIG. 6 shows a flowchart of a procedure 100 which is performed by a manufacturer when making the cable guide 32 of FIGS. 3 through 5. In step 102, the manufacturer provides the arm member 48 having the set of support portions 50, the set of hinges 52 and the set of cable retainers 84. As mentioned earlier, the various portions 50, 52, 84 of the arm member 84 are integrated together to form a contiguous, unitary body which is configured to control movement of the set of cables 32. A process which is suitable for forming the arm member 48 is molding the arm member 48 from molten plastic material (e.g., supplying molten polypropylene material into a mold using an injection molding process). The resulting non-conductive arm member 48 provides flexibility, resiliency and durability which is suitable controlling movement of the set of cables 34 when used in the cable guide 32.

In step 104, the manufacturer connects the arm member 48 to the first attachment subsystem 60 which is configured to attach to an electronic cabinet frame of the electronic cabinet. In particular, the manufacturer threads the screws 64 onto the support portion 50-A of the arm member 48 (also see FIG. 3).

In step 106, the manufacturer connects the arm member 48 to the second attachment subsystem 62 which is configured to attach to the chassis 28. Here, the manufacturer secures the bracket 74 to the support portion 50-E using the fasteners 76. In one arrangement, the fasteners 76 are rivets, and the manufacturer rigidly joins the arm member 48 and the bracket 74 using the rivets.

The resulting cable guide 32 is a reliable and well-designed means for guiding a set of cables 34. The use of the arm member 48 enables the cable guide 32 to be manufactured at low cost and in a manner that requires minimal subsequent time and effort to complete assembly. Furthermore, since there are less separate components than conventional metal cable carriers, there are fewer potential points of failure in which a part can detach and cause damage in another portion of an electronic system.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the cable guide 32 was described above as moving substantially within a horizontal plane by way of example only. In other applications, the cable guide 32 is well-suited for movement in other orientations such as a vertical plane, a plane which is neither substantially horizontal or vertical, etc.

Additionally, it should be understood that, in other arrangements, the arm member 48 of the cable guide 32 is capable of moving in more than a single, common plane. For example, in some arrangements, the hinges 52 are oriented relative to the support portions 50 so that the arm member 48 moves in multiple planes in response to movement of the chassis 28 relative to the frame 26 (e.g., movement in two planes, movement in more than two planes, etc.).

Furthermore, it should be understood that the attachment subsystems 60, 62 were described above as being screws 64 and a bracket 74 by way of example only. Other attachment mechanisms are suitable for use as well such as grooved or notched interlocking members, captivating teeth which impinge on the support portions 50, etc. Such modifications and enhancements are intended to belong to various embodiments of the invention.

What is claimed is:

1. A cable guide, comprising:
   an arm member that defines a set of support portions and a set of hinges, the set of support portions and the set of hinges being integrated together to form a contiguous, unitary body which is configured to control movement of a set of cables;
   a first attachment subsystem to attach the arm member to an electronic cabinet frame; and
   a second attachment subsystem to attach the arm member to a chassis that slidably mounts to the electronic cabinet frame;
   wherein the set of support portions includes:
   a first lateral portion,
   a second lateral portion, and
   a middle portion which is (i) coupled to the first lateral portion by a first hinge and (ii) coupled to the second lateral portion by a second hinge, the first and second lateral portions being configured to pivot relative to the middle portion substantially within a common plane;
   wherein the contiguous, unitary body formed by the set of support portions and the set of hinges includes homogenous plastic material which provides resiliency and flexibility at the set of hinges to enable the support portions to pivot within the common plane; and
   wherein the second attachment subsystem includes a bracket which is configured to connect the arm member to the chassis, and wherein the bracket defines multiple cable slots to direct cable passage along multiple pathways.

2. The cable guide of claim 1 wherein the arm member further includes:
   a set of cable retainers which is integrated with the set of support portions and the set of hinges to form the contiguous, unitary body which is configured to control movement of the set of cables.

3. The cable guide of claim 1 wherein the homogenous plastic material is substantially polypropylene; and wherein each of the first lateral portion, the second lateral portion and the middle portion has an I-beam cross-sectional shape to provide stiffness to that portion.

4. The cable guide of claim 1 wherein the set of support portions of the arm member further includes an end portion, and wherein the first attachment subsystem includes a set of screws which threads into the end portion to retain the set of screws with the end portion.

5. The cable guide of claim 1 wherein the bracket is formed from sheet metal stock having a first thickness; and wherein the bracket defines, at each cable slot, a grommet having a second thickness that is greater than the first thickness.

6. The cable guide of claim 1 wherein the first lateral portion and the second lateral portion are configured to move toward each other and away from each other, and wherein the cable guide is configured to hold the set of cables between the first lateral portion and the second lateral portion when the first lateral portion and the second lateral portion move toward each other.

7. An electronic cabinet, comprising:
   an electronic cabinet frame;
   a chassis which slidably mounts to the electronic cabinet frame, the chassis being configured to support electronic equipment; and
   a cable guide having:
      an arm member that defines a set of support portions and a set of hinges, the set of support portions and the set of hinges being integrated together to form a contiguous, unitary body which is configured to guide movement of a set of cables configured to connect to the electronic equipment;
      a first attachment subsystem to attach the arm member to the electronic cabinet frame; and
      a second attachment subsystem to attach the arm member to the chassis;
   wherein the set of support portions of the arm member of the cable guide includes:
      a first lateral portion,
      a second lateral portion, and
      a middle portion which is (i) coupled to the first lateral portion by a first hinge and (ii) coupled to the second lateral portion by a second hinge, the first and second lateral portions being configured to pivot relative to the middle portion substantially within a common plane;
   wherein the contiguous, unitary body formed by the set of support portions and the set of hinges includes homogenous plastic material which provides resiliency and flexibility at the set of hinges to enable the support portions to pivot within the common plane; and
   wherein the second attachment subsystem of the cable guide includes a bracket which is configured to connect the arm member to the chassis, and wherein the bracket defines multiple cable slots to direct cable passage along multiple pathways.

8. The electronic cabinet of claim 7 wherein the arm member of the cable guide further includes:
   a set of cable retainers which is integrated with the set of support portions and the set of hinges to form the contiguous, unitary body which is configured to guide movement of the set of cables.

9. The electronic cabinet of claim 7 wherein the homogenous plastic material is substantially polypropylene; and wherein each of the first lateral portion, the second lateral portion and the middle portion has an I-beam cross-sectional shape to provide stiffness to that portion.

10. The electronic cabinet of claim 7 wherein the set of support portions of the arm member further includes an end portion, and wherein the first attachment subsystem includes a set of screws which threads into the end portion to retain the set of screws with the end portion.

11. The electronic cabinet of claim 7 wherein the bracket is formed from sheet metal stock having a first thickness; and
   wherein the bracket defines, at each cable slot, a grommet having a second thickness that is greater than the first thickness.

12. The electronic cabinet of claim 7 wherein the first lateral portion and the second lateral portion are configured to move toward each other and away from each other, and wherein the cable guide is configured to hold the set of cables between the first lateral portion and the second lateral portion when the first lateral portion and the second lateral portion move toward each other.

* * * * *